United States Patent
Seo et al.

(10) Patent No.: US 11,501,981 B2
(45) Date of Patent: Nov. 15, 2022

(54) METHODS FOR FABRICATING SEMICONDUCTOR PACKAGES BY USING A MOLD PRESS WITH AN UPPER CHASE AND A LOWER CHASE

(71) Applicant: SK hynix Inc., Icheon-si (KR)

(72) Inventors: Kyung Beom Seo, Icheon-si (KR); Jong Kyu Moon, Icheon-si (KR); Jong Hyock Park, Icheon-si (KR); Song Na, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/203,508

(22) Filed: Mar. 16, 2021

(65) Prior Publication Data

US 2022/0115247 A1    Apr. 14, 2022

(30) Foreign Application Priority Data

Oct. 14, 2020   (KR) ..................... 10-2020-0133039

(51) Int. Cl.
*H01L 21/56*  (2006.01)
*H01L 23/00*  (2006.01)

(52) U.S. Cl.
CPC .......... *H01L 21/566* (2013.01); *H01L 21/561* (2013.01); *H01L 21/563* (2013.01); *H01L 24/16* (2013.01); *H01L 24/17* (2013.01); *H01L 24/32* (2013.01); *H01L 24/73* (2013.01); *H01L 2224/16145* (2013.01); *H01L 2224/16225* (2013.01); *H01L 2224/17181* (2013.01); *H01L 2224/32145* (2013.01); *H01L 2224/32225* (2013.01); *H01L 2224/73204* (2013.01)

(58) Field of Classification Search
CPC ..... H01L 21/566; H01L 21/563; H01L 24/16; H01L 24/17; H01L 24/32; H01L 24/73; H01L 2224/16145; H01L 2224/16225; H01L 2224/17181; H01L 2224/32145; H01L 2224/32225; H01L 2224/73204; B29C 43/18; B29C 43/34; B29C 2043/5808
USPC ........................... 438/108, 109; 257/21.705
See application file for complete search history.

(56) References Cited

U.S. PATENT DOCUMENTS

| | | | |
|---|---|---|---|
| 8,940,557 B2 | 1/2015 | Kim et al. | |
| 2013/0115735 A1* | 5/2013 | Chen ....................... | B29C 43/18 |
| | | | 257/E21.705 |
| 2014/0264810 A1* | 9/2014 | Hsu ........................ | H01L 21/566 |
| | | | 438/109 |
| 2015/0162265 A1* | 6/2015 | Jo ............................ | H01L 25/50 |
| | | | 257/774 |
| 2017/0278723 A1* | 9/2017 | Lin ......................... | H01L 24/96 |
| 2018/0012865 A1* | 1/2018 | Schrock ................ | H01L 21/565 |
| 2018/0082916 A1* | 3/2018 | Katkar .................... | H01L 24/11 |

(Continued)

*Primary Examiner* — Khiem D Nguyen
(74) *Attorney, Agent, or Firm* — William Park & Associates Ltd.

(57) ABSTRACT

Disclosed is a method for fabricating a semiconductor package. A mold press with upper and lower chases is used. A molded underfill (MUF) material is dispensed on a bottom surface of a mold cavity to form a first dispensed pattern with a serpentine shape. A base substrate on which die stacks are mounted is loaded on the upper chase. The mold cavity in which the die stacks are inserted is closed and MUF material flows between the die stacks to impregnate the die stacks.

15 Claims, 16 Drawing Sheets

(56) References Cited

U.S. PATENT DOCUMENTS

2018/0130773 A1* 5/2018 Bitz ................ H01L 25/50
2018/0294169 A1* 10/2018 Hembree ............ H01L 21/565

* cited by examiner

METHODS FOR FABRICATING SEMICONDUCTOR PACKAGES BY USING A MOLD PRESS WITH AN UPPER CHASE AND A LOWER CHASE

CROSS-REFERENCE TO RELATED APPLICATIONS

The present application claims priority under 35 U.S.C. 119(a) to Korean Application No. 10-2020-0133039, filed on Oct. 14, 2020, which is incorporated herein by reference in its entirety.

BACKGROUND

1. Technical Field

The present disclosure generally relates to a packaging technology and, more particularly, to methods for fabricating semiconductor packages.

2. Related Art

In the processes of fabricating semiconductor packages, there is a process of forming a molded underfill (MUF). The process for forming the MUF involves forming an underfill layer and forming an encapsulant layer in a single process, which were previously independently performed. A semiconductor package may be formed by flip-chip bonding a semiconductor die on a substrate and forming an MUF.

The MUF may include an underfill portion filling a space between a semiconductor die and a substrate, and an encapsulant portion that covers and protects the underfill portion and the semiconductor die. The underfill portion may be formed to fill a space between semiconductor dies that are stacked perpendicularly to each other. The underfill portion may serve to insulate and protect connectors that electrically and physically connect the semiconductor dies to the substrate.

SUMMARY

An aspect of the present disclosure presents a method for fabricating a semiconductor package. The method may be performed by using a mold press with an upper chase and a lower chase providing a mold cavity. The method may include: dispensing a molded underfill (MUF) material on a bottom surface of the mold cavity to form a first dispensed pattern with a serpentine shape; loading a base substrate on which die stacks are mounted on the upper chase; and closing the mold cavity and causing the MUF material to impregnate the die stacks to mold the MUF material into an MUF.

DETAILED DESCRIPTION

Figure 1:
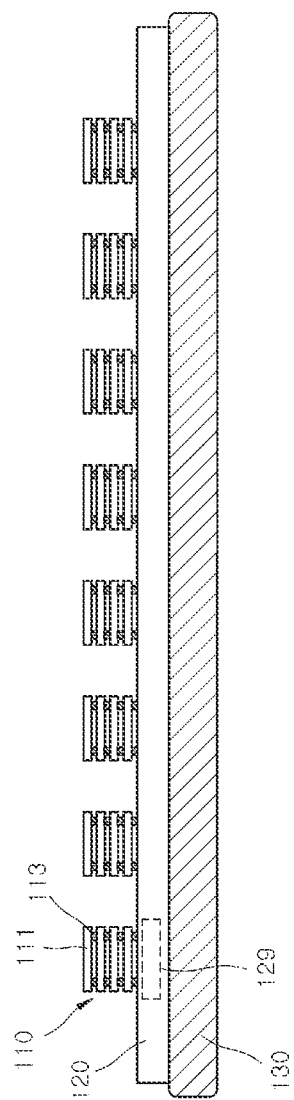
FIG. 1 is a schematic cross-sectional view illustrating a base substrate on which die stacks are disposed according to an embodiment of the present disclosure.

The meanings of the terms used in the various embodiments may be construed according to commonly understood meanings by one with ordinary skill in the art to which the embodiments belong. Unless otherwise defined, the terms used herein have the same meaning as commonly understood by one of ordinary skill in the art to which the embodiments belong.

In the description of the examples of the present disclosure, the terms, such as "first" and "second", "top" and "bottom or lower" are intended to distinguish the elements, but are not used to limit the elements or to mean specific order. These terms mean a relative positional relationship, but do not limit the specific case in which another element is further introduced at or directly in contact with the element. The same interpretation can be applied to other expressions describing the relationship between elements.

The semiconductor device may include a semiconductor substrate or a structure in which a plurality of semiconductor substrates are stacked. The semiconductor device may indicate a semiconductor package structure in which a structure in which semiconductor substrates are stacked is packaged. The semiconductor substrate may indicate a semiconductor wafer, a semiconductor die, or a semiconductor chip in which electronic components and devices are integrated. The semiconductor chip may indicate memory chips in which memory integrated circuits, such as dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) are integrated, logic dies or ASIC chips in which logic circuits are integrated in a semiconductor substrate, or processor, such as application processors (Aps), graphic processing units (GPUs), central processing units (CPUs) or system-on-chips (SoCs). The semiconductor devices may be employed in information communication systems, such as mobile phones, electronic systems associated with biotechnology or health care, or wearable electronic systems. The semiconductor packages may be applicable to Internet of things (IoT).

The same reference numerals refer to same devices throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

Figure 2:
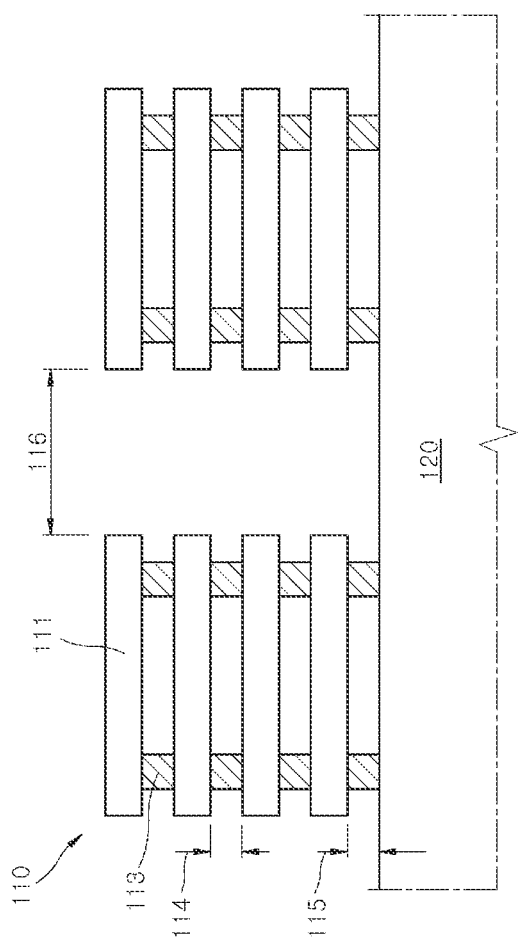
FIG. 2 is a schematic view illustrating an enlarged view of the die stacks of FIG. 1.
Figure 3:
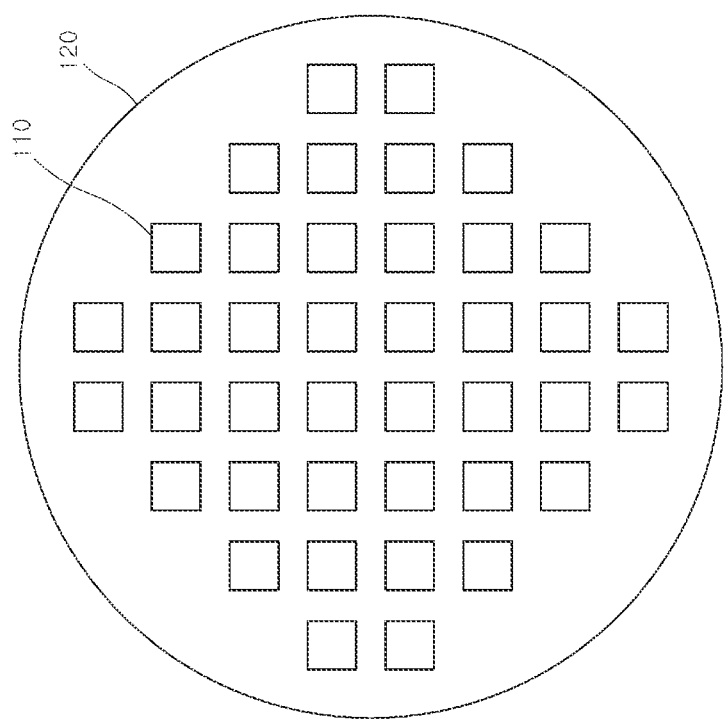
FIG. 3 is a schematic plan view illustrating a shape in which the die stacks of FIG. 1 are arranged.

FIG. 1 is a schematic cross-sectional view illustrating a base substrate 120 on which die stacks 110 are disposed, according to an embodiment of the present disclosure. FIG. 2 is a schematic view illustrating an enlarged view of the die stacks 110 of FIG. 1. FIG. 3 is a schematic plan view illustrating a shape in which the die stacks 110 of FIG. 1 are arranged.

Referring to FIGS. 1 and 2, the base substrate 120 on which the die stacks 110 are disposed may be used in the method for fabricating the semiconductor package. In a non-limiting embodiment, the base substrate 120 may be a semiconductor wafer with integrated circuits 129 or a portion of the semiconductor wafer. The integrated circuits 129 that are integrated on the semiconductor wafer may include active devices, such as transistors or passive devices, such as capacitors or inductors. In an embodiment, the base substrate 120 may be a semiconductor wafer with memory devices as the integrated circuits 129. In an embodiment, the base substrate 120 may be a wiring structure with a wiring circuit structure, such as a printed circuit board (PCB).

The die stacks 110 may be configured by stacking semiconductor dies 111 perpendicularly to each other on the base substrate 120. The semiconductor dies 111 may include memory devices.

The semiconductor dies 111 that are stacked on each other to form the die stack 110 may be vertically connected to each other by conductive connectors 113. Some of the connectors 113 may vertically connect the vertically stacked semiconductor dies 111 to each other. Other parts of the connectors 113 may vertically connect the semiconductor dies 111 to the base substrate 120. The connectors 113 may be introduced as conductive members, such as conductive bumps. In an embodiment, each of the connectors 113 may be introduced in the form of a conductive post or a conductive stud.

The connectors 113 may be disposed between the semiconductor dies 111 that are disposed perpendicularly to each other so that the semiconductor dies 111 are vertically spaced apart from each other. Accordingly, a first gap 114 may be formed between the stacked semiconductor dies 111. In addition, a second gap 115 may be formed between the lowermost semiconductor die 111 and the base substrate 120. The die stack 110 and an adjacent die stack may be disposed on the base substrate 120 while being spaced apart from each other by a third gap 116. An underfill portion of the molded underfill (MUF) may be formed to fill the first, second, and third gaps 114, 115, and 116.

In an embodiment, the die stack 110 may be configured by flip-chip mounting only one semiconductor die 111 on the base substrate 120. The die stack 110 may be configured by disposing at least one semiconductor die 111 on the base substrate 120.

Referring to FIGS. 1, 2, and 3, another die stack 110 may be disposed next to one die stack 110 on the base substrate 120. A plurality of die stacks 110 may be arranged on the base substrate 120 in a horizontal direction and a vertical direction.

Referring again to FIG. 1, the base substrate 120 may be attached on a carrier 130. In a state in which the base substrate 120 is attached on the carrier 130, a stacking process for disposing the die stacks 110 on the base substrate 120 may be performed.

Figure 4:
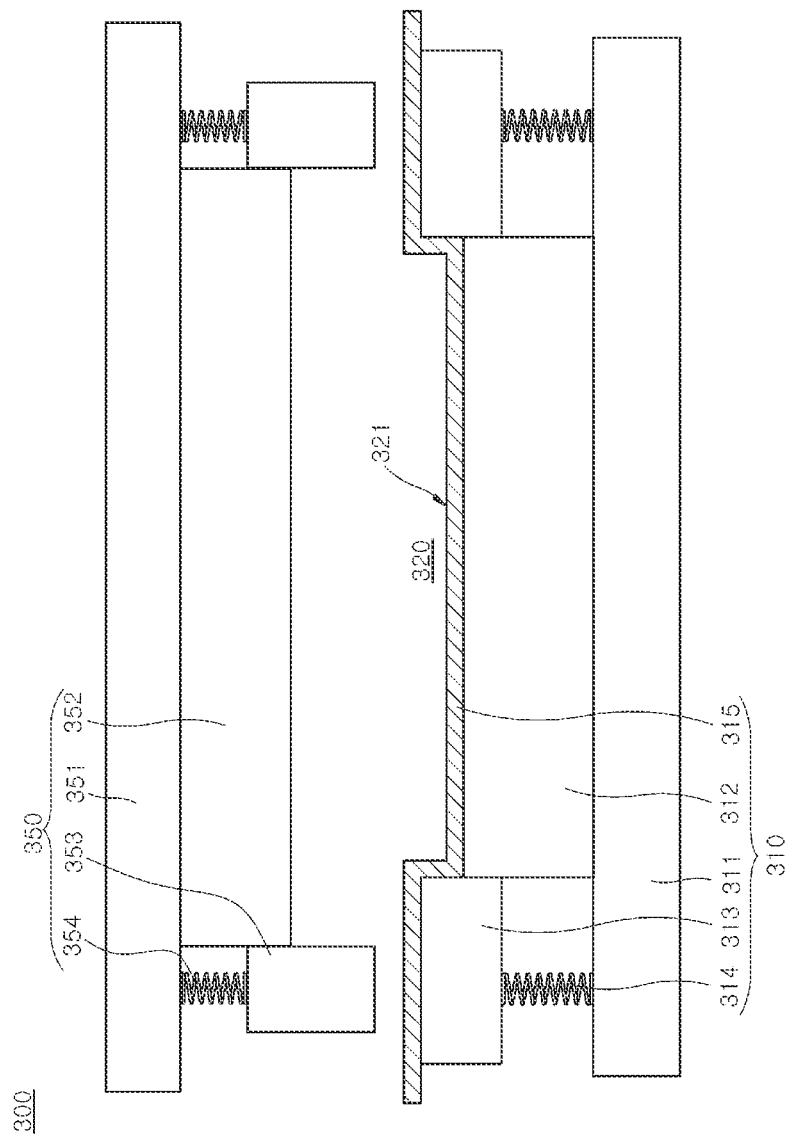
FIG. 4 is a schematic cross-sectional view illustrating a mold press according to an embodiment of the present disclosure.

FIG. 4 is a schematic cross-sectional view illustrating a mold press 300 according to an embodiment of the present disclosure.

Referring to FIG. 4, the method for fabricating a semiconductor package according to an embodiment of the present disclosure may be performed by using the mold press 300. The mold press 300 may include a lower chase 310 and an upper chase 350. The lower chase 310 may be configured as a lower mold that provides a mold cavity 320 that substantially provides a shape of an MUF. The base substrate (120 of FIG. 1) on which the die stacks (110 in FIG. 1) are disposed may be loaded on the upper chase 350. The die stacks 110 may be positioned to be substantially inserted into the mold cavity 320.

The lower chase 310 may include a lower press 311, a lower chase bottom 312, and a lower chase side 313. The lower chase bottom 312 and the lower chase side 313 may be assembled together to provide the mold cavity 320 into which the die stacks 110 are to be inserted. The MUF may be molded to fill the mold cavity 320 so that the mold cavity 320 may have a specific shape that in turn provides the shape for the molded MUF.

The lower chase bottom 312 may rise and fall along an inner side surface of the lower chase side 313 based on the rising and falling operations of the lower press 311. The lower chase side 313 may be configured as a tube-shaped member. The lower chase side 313 may be connected to and supported by the lower press 311 by lower elastic portions 314. The lower elastic portion 314 may include an elastic member, such as a spring.

A release film 315 may be further included in the lower chase 310. The release film 315 may be introduced as an element that helps when the MUF is separated from the lower chase 310 after being molded. The release film 315 may be an element that helps to form a vacuum in the mold cavity 320 in the molding process for forming the MUF. A bottom surface 321 of the mold cavity 320 may be substantially the surface of the release film 315.

The upper chase 350 may include an upper press 351, an upper chase body 352, and an upper chase wall 353. The upper chase body 352 may rise and fall along an inner side surface of the upper chase wall 353 based on the falling and rising operations of the upper press 351. The upper chase wall 353 may be configured as a tube-shaped member. The upper chase wall 353 may be connected to and supported by the upper press 351 by upper elastic portions 354. The upper elastic portion 354 may include an elastic member, such as a spring.

Figure 5:
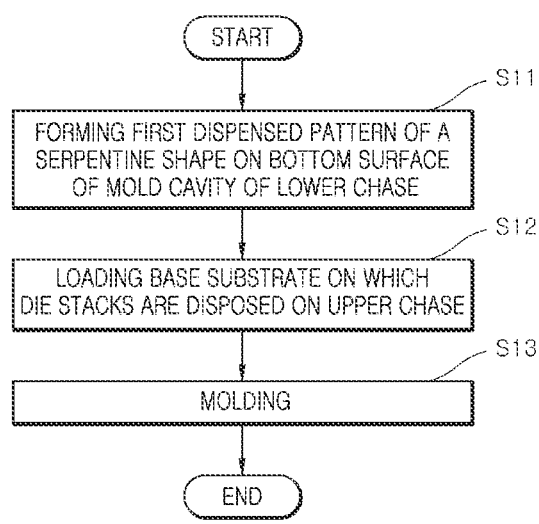
FIG. 5 is a flowchart illustrating a method for fabricating a semiconductor package according to an embodiment of the present disclosure.
Figure 6:
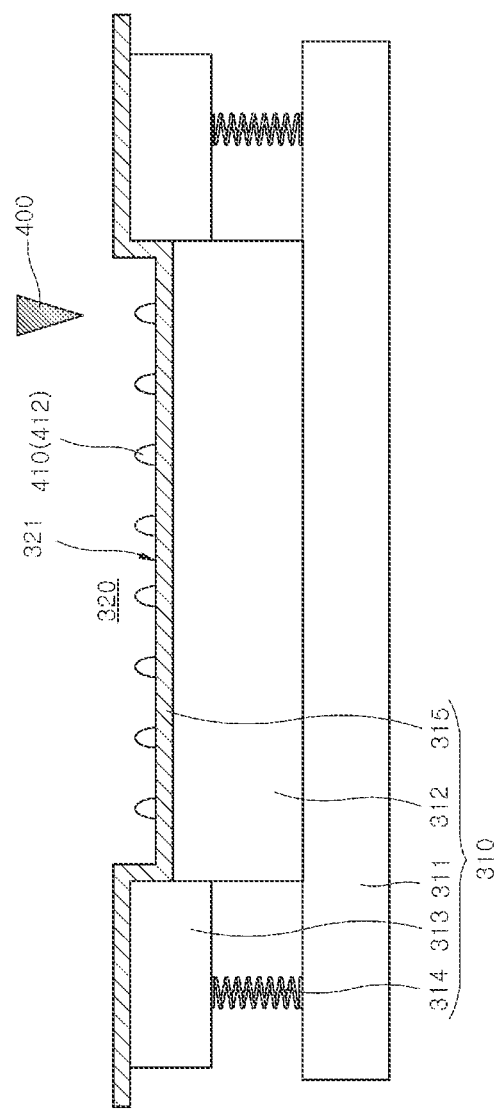
FIG. 6 is a schematic view illustrating a process for forming a first dispensed pattern of FIG. 5.
Figure 7:
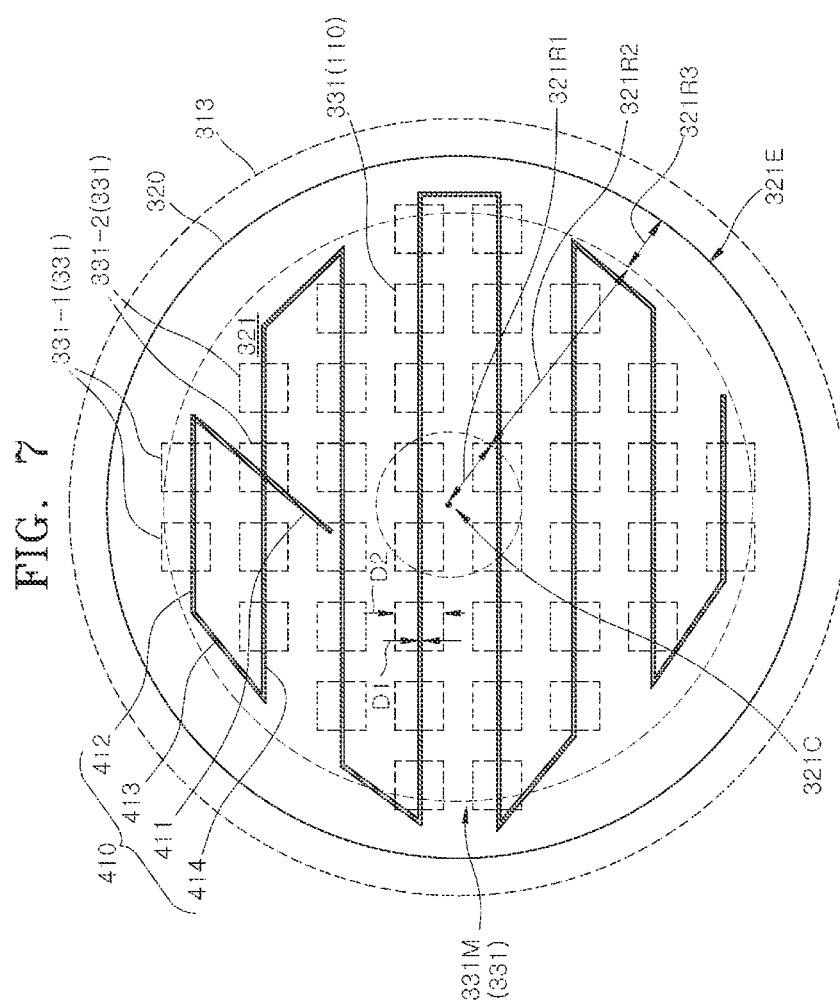
FIG. 7 is a schematic plan view illustrating an example of a planar shape of the first dispensed pattern of FIG. 6.

FIG. 5 is a flowchart illustrating a method for fabricating a semiconductor package according to an embodiment of the present disclosure. FIG. 6 is a schematic cross-sectional view illustrating a process S11 for forming a first dispensed pattern 410 of FIG. 5. FIG. 7 is a schematic plan view illustrating an example of a planar shape of the first dispensed pattern 410 of FIG. 6.

Referring to FIGS. 5 and 6, the method for fabricating the semiconductor package according to an embodiment may include the process S11 for forming the first dispensed pattern 410 on a bottom surface 321 of a mold cavity 320 of a lower chase 310 (S11). The first dispensed pattern 410 may have the shape of a serpentinely folded line pattern as illustrated in FIG. 7.

Referring to FIG. 6, a dispensing nozzle 400 may be introduced over the bottom surface 321 of the mold cavity 320 of the lower chase 310, and an MUF material may be dispensed through the dispensing nozzle 400. By dispensing the MUF material while moving the dispensing nozzle 400 over the bottom surface 321, the first dispensed pattern 410 may be formed to have a serpentine shape as illustrated in FIG. 7. The MUF material may be dispensed in a single-brush drawing method, so that the first dispensed pattern 410 may be formed to have a continuous pattern shape. The first dispensed pattern 410 might not be formed to cover the entire area of the bottom surface 321, but may extend so that some portions of the pattern are partially distributed within the area of the bottom surface 321.

Referring to FIG. 7 again, the first dispensed pattern 410 may have a continuous pattern shape with a leading portion 411, first and second linear portions 412 and 414, and a folded portion 413. The bottom surface 321 of the mold cavity 320 may include a central region 321R1, a middle region 321R2, and an edge region 321R3.

The central region 321R1 of the bottom surface 321 of the mold cavity 320 may be a region with a center 321C of the bottom surface 321. The central region 321R1 may be a region that extends outward by a distance from the center 321C of the bottom surface 321. The central region 321R1 may be a region with several die stack overlap regions 331.

The die stack overlap regions 331 may be regions in which the die stacks 110 of FIG. 1 overlap with the bottom surface 321 of the mold cavity 320. When the die stacks 110 or the base substrate (120 in FIG. 1) are/is loaded on the mold cavity 320, the die stacks 110 may be positioned to overlap with the die stack overlap regions 331, respectively.

The edge region 321R3 of the bottom surface 321 of the mold cavity 320 may be a region that extends inward by a distance from an edge 321E of the bottom surface 321. The edge region 321R3 may be a region that extends to be partially overlapped with the outermost die stack overlap region 331M that is located furthest from the center 321C among the die stack overlap regions 331. A portion of the edge region 321R3 may overlap with the outermost die stack overlap region 331M, but most of the edge region 321R3 might not include the die stack overlap region 331.

The middle region 321R1 of the bottom surface 321 of the mold cavity 320 may be a region between the central region 321R1 and the edge region 321R3.

Referring to FIGS. 7 and 6 again, the leading portion 411 of the first dispensed pattern 410 may be a starting portion at which the dispensing nozzle 400 forms the first dispensed pattern 410. The dispensing nozzle 411 may work such that the leading portion 411 of the first dispensed pattern 410 starts to be formed in the middle region 321R2 and extends to the edge region 321R3 of the bottom surface 321 of the mold cavity 320. At the starting point at which the dispensing nozzle 400 discharges the MUF material, it is difficult to control the discharge amount, which may lead to an excessive amount being discharged unintentionally. If the MUF material is excessively discharged from the dispensing nozzle 400 in the edge region 321R3 of the bottom surface 321 of the mold cavity 320, a defect, such as a mold flash may be caused in the molding process. In order to suppress and prevent such defects in advance, dispensing of the MUF material by the dispensing nozzle 400 may be started within the middle region 321R2 of the bottom surface 321 of the mold cavity 320.

The first linear portion 412 of the first dispensed pattern 410 may be formed to cross the first row of die stack overlap regions 331-1 among the die stack overlapping regions 331. The first row of die stack overlap regions 331-1 may refer to die stack overlap regions 331 that are arranged in rows in a horizontal direction in FIG. 7. The second linear portion 414 of the first dispensed pattern 410 may be formed to cross a second row of die stack overlap regions 331-2 among the die stack overlap regions 331. The second row of die stack overlap regions 331-2 may refer to die stack overlap regions 331 that are disposed adjacent to the first row of die stack overlap regions 331-1. The folded portion 413 of the first dispensed pattern 410 may be formed to connect the first linear portion 412 and the second linear portion 414. As such, the first dispensed pattern 410 is formed so that the shape with the first linear portion 412 and the second linear portion 414, and the shape with the folded portion 413 are alternately repeated, thereby implementing the serpentine shape of the first dispensed pattern 410.

The linear portions 412 and 414, which are portions of the first dispensed pattern 410, may be formed to cross the die stack overlap regions 331 that overlap with at least one die stack (110 in FIG. 1). Each of the linear portions 412 and 414 of the first dispensed pattern 410 may be formed to have a width D1 that is narrower than a width D2 of the die stack overlap region 331.

As the linear portions 412 and 414 of the first dispensed pattern 410 cross the die stack overlap regions 331, the portions of the first dispensed pattern 410 that pass through the regions that overlap with the third gap (116 in FIG. 1) between the die stacks (110 of FIG. 1) can be substantially reduced or substantially minimized. While the portions of the first dispensed pattern 410 that passes through the regions that overlap with the third gap 116 between the die stacks 110 are minimized, it is possible to substantially suppress, substantially reduce, or substantially minimize a phenomenon in which voids are trapped therein while the MUF material is molded.

Figure 16:
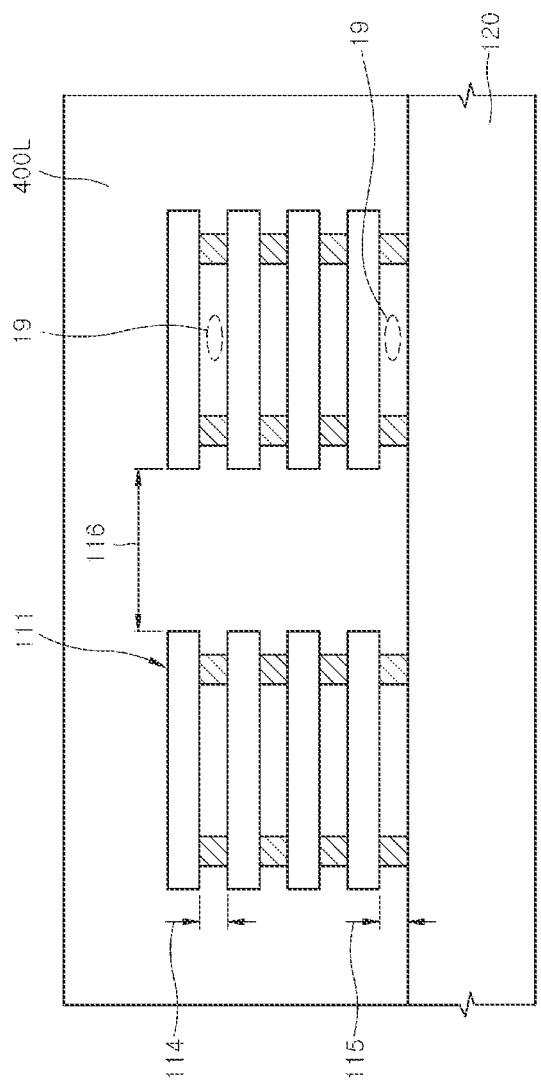
FIG. 16 is a schematic cross-sectional view illustrating an effect of reducing voids according to a method for fabricating a semiconductor package according to an embodiment of the present disclosure.

FIG. 16 is a schematic cross-sectional view illustrating an effect of reducing voids 19 by the method of fabricating a semiconductor package according to an embodiment of the disclosure.

Referring to FIGS. 16 and 7, the die stacks 110 may be MUF-molded substantially without the generation of the voids 19 by using the first dispensed pattern 410 that is formed by dispensing the MUF material.

Most portions of the first dispensed pattern 410 may be disposed in the die stack overlap regions 331 that overlap with the die stacks 110 so that the rate at which the MUF material flows between the semiconductor dies 111 and between the semiconductor dies 111 and the base substrate 120 can be improved. It is possible to induce the introduction of the MUF material faster into the first gap 114 and the second gap 115 than the completely filling the third gap 116 between the die stacks 110 by the MUF material. Accordingly, before the MUF material completely fills the third gap 116 between the die stacks 110 and the voids 19 are trapped in the first gap 114 or the second gap 115, it is possible to induce the MUF material to substantially completely fill either the first gap 114 or the second gap 115.

As the portion of the first dispensed pattern 410 that passes through the region of the bottom surface 321 of the mold cavity 320 that overlap with the third gap 116 between the die stacks 110 is substantially minimized, the amount of the MUF material that can flow into the third gap 116 between the die stacks 110 may be relatively reduced compared to the total amount of the MUF material. Accordingly, it may be possible that the MUF material completely fills the first gap 114 and the second gap 115 before the MUF material completely fills the third gap 116 between the die stacks 110.

Accordingly, the occurrence of voids 19 in the MUF layer 400L can be substantially prevented, substantially suppressed, or effectively reduced.

Figure 8:
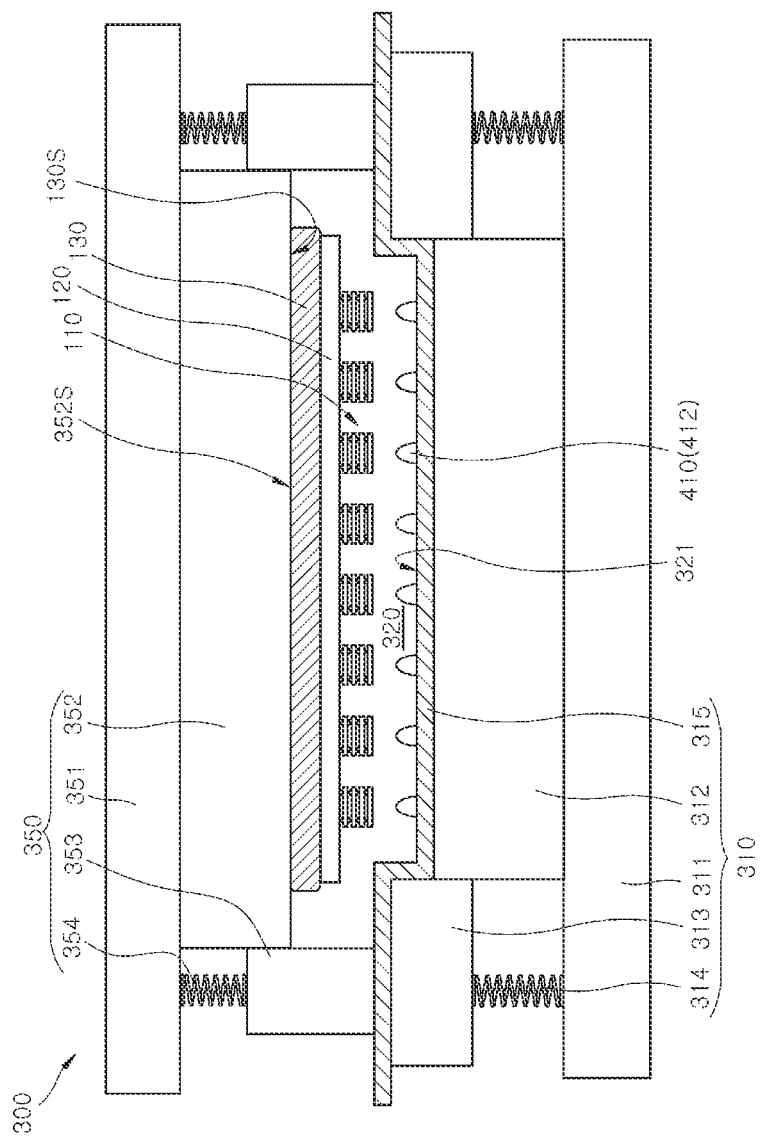
FIG. 8 is a schematic view illustrating a process for loading a base substrate of FIG. 5 on an upper chase.

FIG. 8 is a schematic diagram illustrating a process S12 for loading the base substrate 120 of FIG. 5 on the upper chase 350.

Referring to FIGS. 8 and 5, the method for fabricating the semiconductor package according to an embodiment of the present disclosure may include the process S12 for loading the base substrate 120 on the upper chase body 352 of the upper chase 350. A backside 130S of the carrier 130 on which the base substrate 120 is disposed may be held on a surface 352S of the upper chase body 352. The backside 130S of the carrier 130 may be vacuum-adsorbed on the surface 352S of the upper chase body 352 by a vacuum holding system (not illustrated).

After the base substrate 120 is loaded on the upper chase 350, the upper chase 350 is lowered or the lower chase 310 is raised, or the lower chase 310 and the upper chase 350 are simultaneously operated, and thus, the upper chase wall 353 may be in close contact with the release film 315. Accordingly, the inner space that is formed by the upper chase wall 353 and the lower chase 310 may be disconnected from the outside, and a vacuum may be induced in the inner space. By inducing a vacuum state in the inner space formed by the upper chase wall 353 and the lower chase 310, it is possible to reduce the occurrence of voids during the MUF molding process more effectively.

Figure 9:
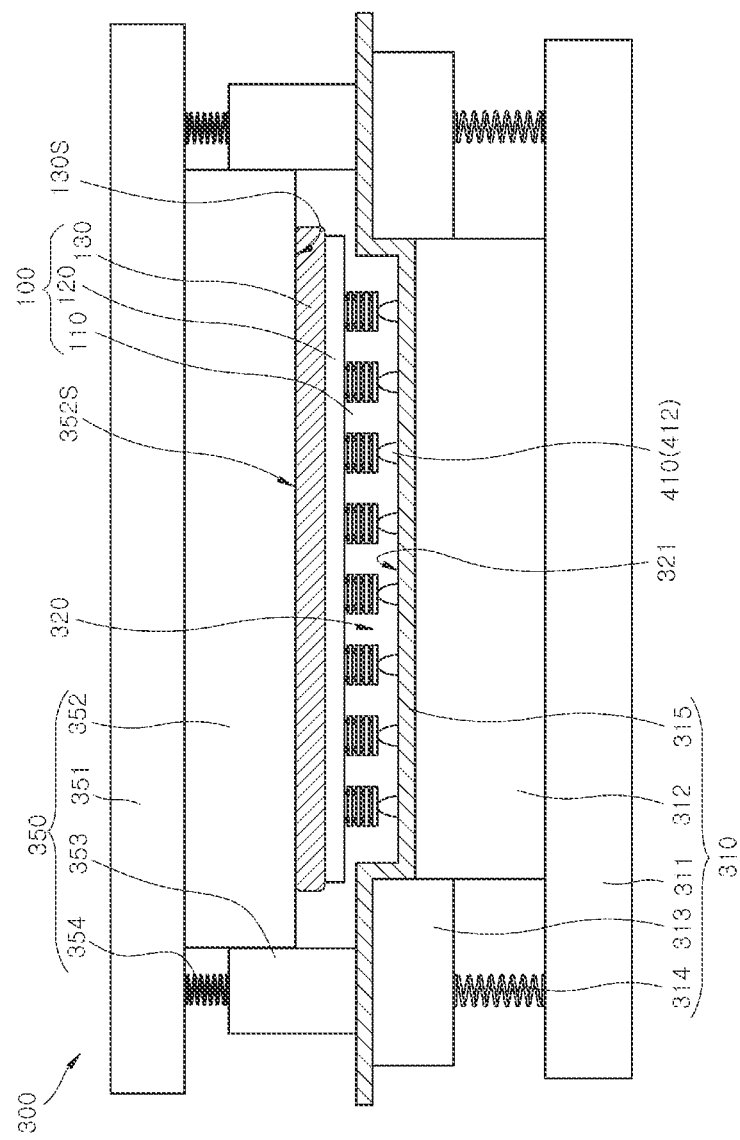
FIGS. 9 and 10 are schematic views illustrating a molding process of FIG. 5.
Figure 10:
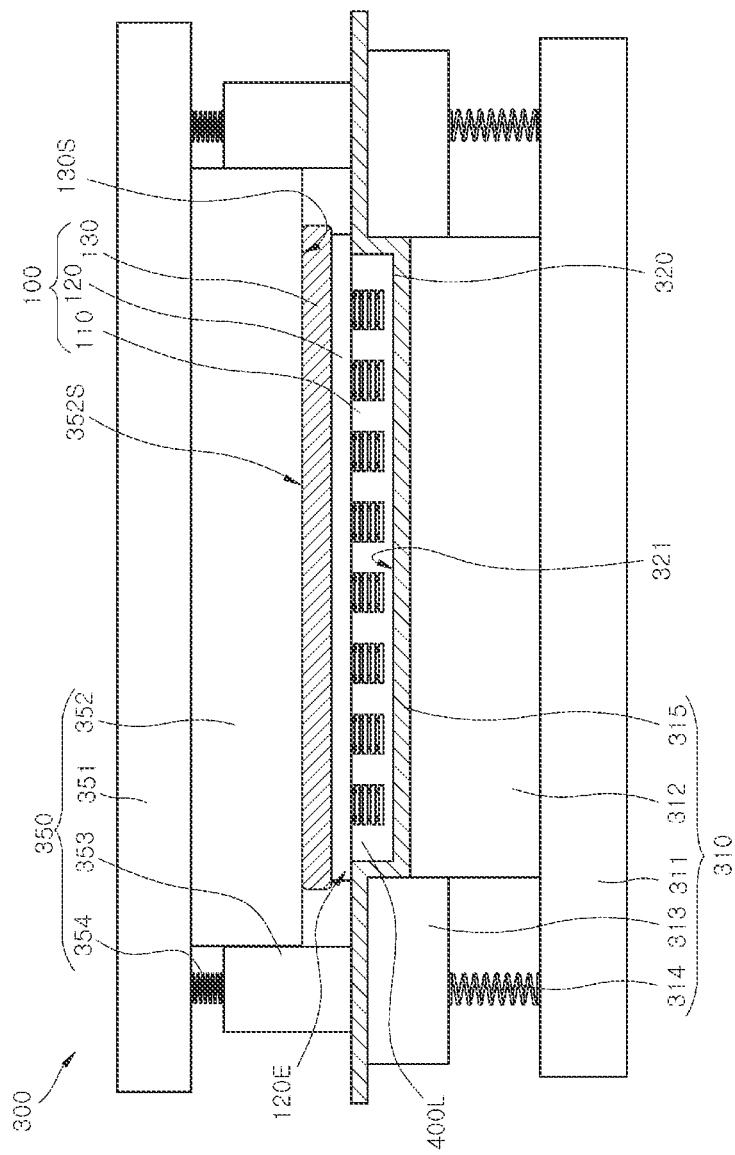
Figure 11:
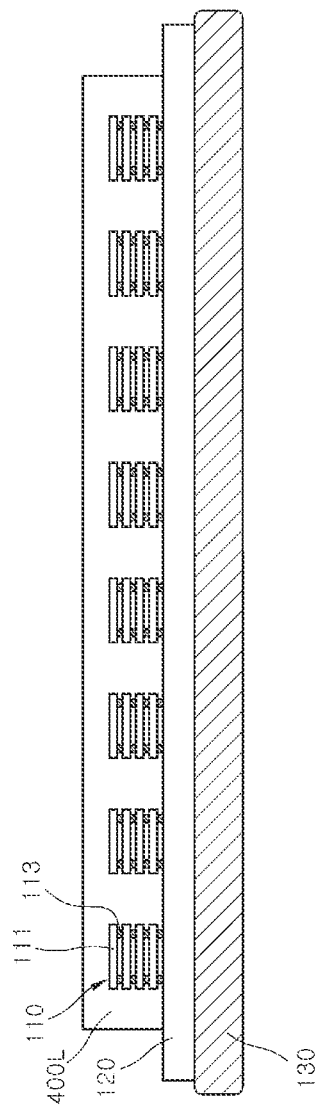
FIG. 11 is a schematic view illustrating a semiconductor package according to an embodiment of the present disclosure.

FIGS. 9 and 10 are schematic views illustrating a molding process S23 of FIG. 5. FIG. 11 is a schematic view illustrating a semiconductor package according to an embodiment of the present disclosure.

Referring to FIGS. 9, 10, and 5, the method of fabricating the semiconductor package may include a process S13 of operating the upper chase 350 and the lower chase 310 to close the mold cavity 320 and to mold an MUF layer 400L. As illustrated in FIG. 9, by operating the upper press 351 to lower the upper chase body 352, the die stacks 110 may be inserted into the mold cavity 320. The lower press 311 may be operated to cause the lower chase bottom 312 to rise.

By continuously operating the upper press 351 or the lower press 311, the mold cavity 320 may be closed by making the edge portion 120E of the base substrate 120 to be in close contact with the release film 315, as illustrated in FIG. 10. After the mold cavity 320 is closed, the dispensed first dispensed pattern 410 may be pressurized or heated to flow.

Referring to FIGS. 10 and 16, the MUF material of the first dispensed pattern (410 of FIG. 9) may flow between the die stacks 110 to impregnate the die stacks 110. The MUF material of the first dispensed pattern 410 may flow into the first gap 114, the second gap 115, and the third gap 116 to fill the first gap 114, the second gap 115, and the third gap 116 substantially completely. Thereafter, the MUF material may be cooled and induced to have a shape of the mold cavity 320 so that the molded MUF layer 400L may be formed.

The upper chase 350 and the lower chase 310 may be released from each other so that the mold cavity 320 is exposed to the outside, and the base substrate 120 on which the MUF layer 400L is formed may be separated from the mold press 300. The semiconductor package in which the MUF layer 400L is formed may have a structure in which the MUF layer 400L is formed on the base substrate 120 to cover the die stacks 110, as illustrated in FIG. 11.

Figure 12:
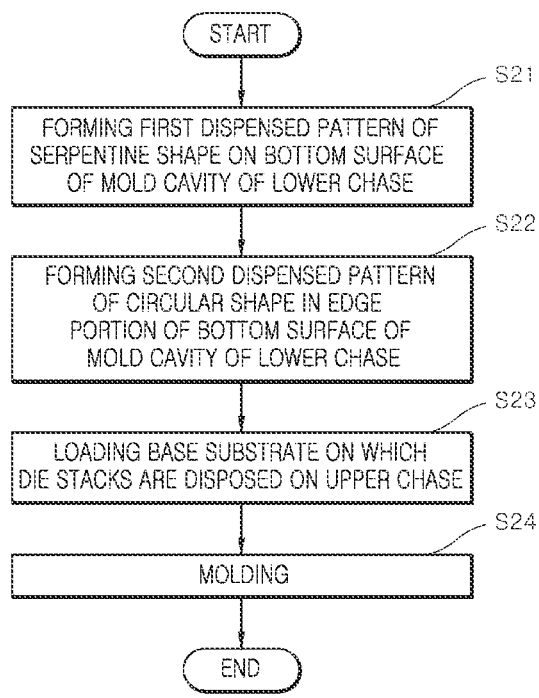
FIG. 12 is a flowchart illustrating a method for fabricating a semiconductor package according to an embodiment of the present disclosure.
Figure 13:
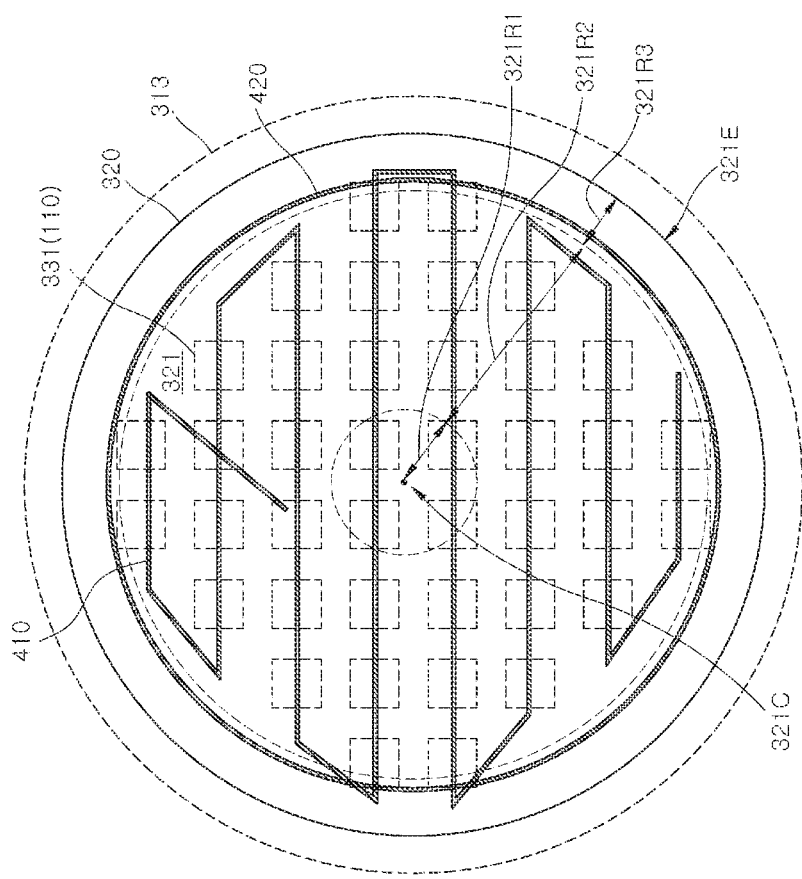
FIG. 13 is a schematic plan view illustrating a process for forming a second dispensed pattern of FIG. 12.

FIG. 12 is a flowchart illustrating a method for fabricating a semiconductor package according to an embodiment of the present disclosure. FIG. 13 is a schematic plan view illustrating a process for forming a second dispensed pattern 420 of FIG. 12.

Referring to FIGS. 12 and 13, the method for fabricating the semiconductor package may include a process S21 for forming the first dispensed pattern 410 with a serpentine shape on a bottom surface 321 of a mold cavity 320 of a lower chase 310, the process S22 for forming the second dispensed pattern 420 with a circular shape in an edge region 321R3 of the bottom surface 321 of the mold cavity 320 of the lower chase 310, a process S23 for loading a base substrate 120 on an upper chase body (352 of FIG. 4) of an upper chase (350 of FIG. 4), and a process S24 for molding the mold the MUF material into an MUF layer.

The first dispensed pattern 410 may be formed on the bottom surface 321 of the lower chase 310, and the second dispensed pattern 420 may be formed by dispensing the MUF material on the edge region 321R3 of the bottom surface 321 by using the dispensing nozzle (400 of FIG. 6). The second dispensed pattern 420 may include a continuous pattern that extends along the edge region 321R of the bottom surface 321 of the lower chase 310. The second dispensed pattern 420 may be formed in a circular shape. The second dispensed pattern 420 may be formed to be partially overlapped with the first dispensed pattern 410.

In most of the edge region 321R3 of the bottom surface 321 of the mold cavity 320, the die stack overlap regions 331 might not be disposed. Accordingly, the space of the mold cavity 320 that is located in the edge region 321R3 is mostly filled with the MUF material. In a middle region 321R2, the die stack overlap regions 331 may be disposed to be relatively denser. Accordingly, the space of the mold cavity 320 that is located in the middle region 321R2 may be filled with the die stacks 110 and the MUF material.

In order to fill the space of the mold cavity 320 that is located in the edge region 321R3 with the MUF material, it may be required to dispense a relatively larger amount of the MUF material compared to the middle region 321R2. The second dispensed pattern 420 may be formed so that a relatively larger amount of the MUF material is dispensed on the edge region 321R3. Accordingly, it is possible to effectively prevent, substantially suppress, or substantially reduce the occurrence of filling defects in which the MUF material is insufficient on the edge region 321R3 of the bottom surface 321 of the mold cavity 320.

Figure 14:
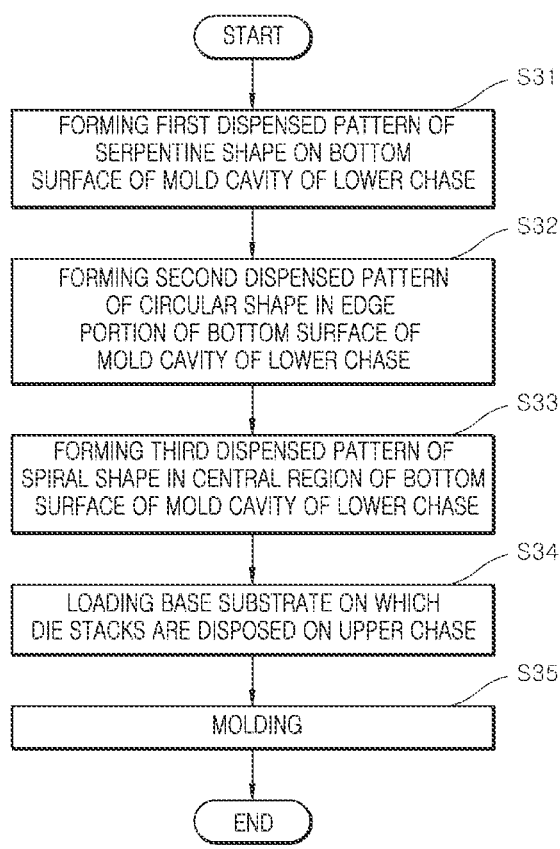
FIG. 14 is a flowchart illustrating a method for fabricating a semiconductor package according to an embodiment of the present disclosure.
Figure 15:
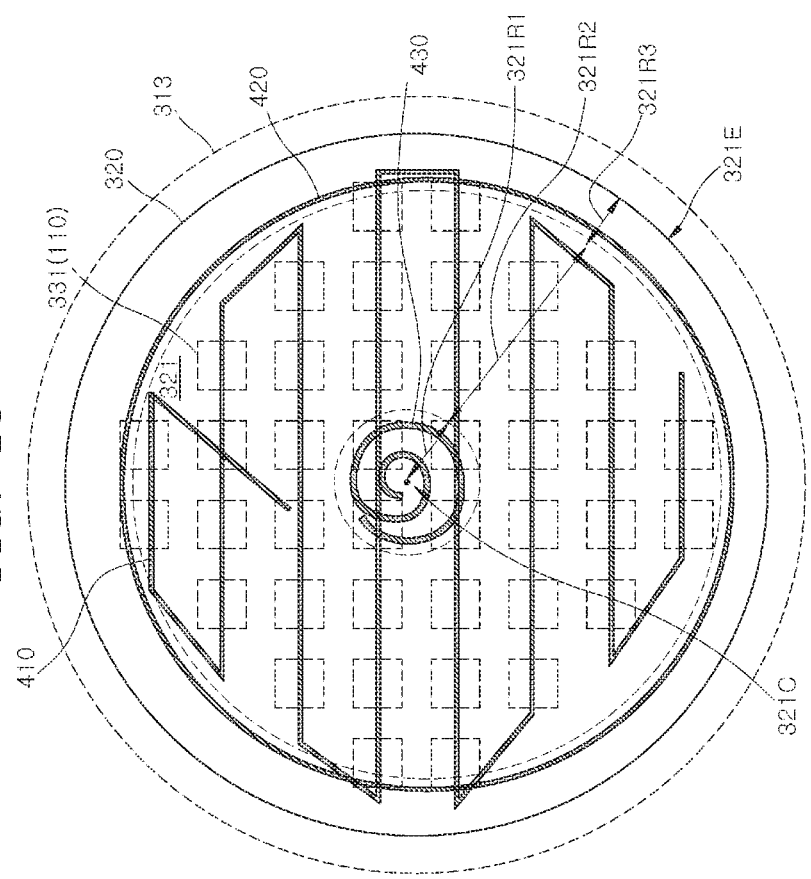
FIG. 15 is a schematic plan view illustrating a process for forming a third dispense pattern of FIG. 14.

FIG. 14 is a flowchart illustrating a method for fabricating a semiconductor package according to an embodiment of the present disclosure. FIG. 15 is a schematic plan view illustrating a process S33 for forming a third dispensed pattern 430 of FIG. 14.

Referring to FIGS. 14 and 15, the method for fabricating a semiconductor package may include a process S31 for forming a first dispensed pattern 410 in a serpentine shape on a bottom surface 321 of a mold cavity 320 of a lower chase 310, a process S32 for forming a second dispensed pattern 420 with a circular shape in an edge region 321R3 of the bottom surface 321 of the mold cavity 320 of the lower chase 310, the process S33 for forming the spiral-shaped third dispensed pattern 430 in a central region 321R1 of the bottom surface 321 of the mold cavity 320 of the lower chase 310, a process S34 for loading a base substrate 120 on an upper chase body 352 of an upper chase (350 in FIG. 4), and a process S35 for molding an MUF material into an MUF layer.

The first dispensed pattern 410 and the second dispensed pattern 420 may be formed on the bottom surface 321 of the lower chase 310, and the MUF material may be dispensed in the central region 321R1 of the bottom surface 321 by using a dispensing nozzle (400 of FIG. 6) to form the third dispensed pattern 430. The third dispensed pattern 430 may be formed to partially overlap with the first dispensed pattern 410. The third dispensed pattern 430 may be formed to dispense a relatively larger amount of the MUF material in the central region 321R1 of the bottom surface 321 of the mold cavity 320 compared to the middle region 321R2. The third dispensed pattern 430 may induce the MUF material to flow from the central region 321R1 of the bottom surface 321 of the mold cavity 320 to the middle region 321R2, etc., so that the occurrence of voids in the central region 321R1 of the mold cavity 320 can be effectively prevented or reduced.

The inventive concept has been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but an illustrative standpoint. The scope of the inventive concept is not limited to the above descriptions but defined by the accompanying claims, and all of distinctive features in the equivalent scope should be construed as being included in the inventive concept.

What is claimed is:

1. A method for fabricating a semiconductor package by using a mold press with an upper chase and a lower chase providing a mold cavity, the method comprising:
    dispensing a molded underfill (MUF) material on a bottom surface of the mold cavity to form a first dispensed pattern with a serpentine shape;
    loading a base substrate on which die stacks are mounted on the upper chase; and
    closing the mold cavity and causing the MUF material to impregnate the die stacks to mold the MUF material into an MUF layer,
    wherein the first dispensed pattern comprises:
    a first linear portion passing across a first row of die stack overlap regions among a plurality of die stack overlap regions of the bottom surface of the mold cavity with which the die stacks overlap;
    a second linear portion passing across a second row of die stack overlap regions among the die stack overlap regions; and
    a folded portion connecting the first linear portion and the second linear portion.

2. The method of claim 1, wherein the first dispensed pattern comprises a continuous portion that passes across a die stack overlap region of the bottom surface of the mold cavity, overlapping with at least one die stack.

3. The method of claim 2, wherein the continuous portion of the first dispensed pattern has a width that is narrower than a width of the die stack overlap region of the bottom surface of the mold cavity.

4. The method of claim 1, wherein the bottom surface of the mold cavity comprises:
    an edge region that extends from an edge of the bottom surface to partially overlap with an outermost die stack overlap region among the die stack overlap regions;
    a central region including a center of the bottom surface; and
    a middle region between the central region and the edge region, and
    wherein the first dispensed pattern starts in the middle region, and further comprises a leading portion that is connected to the first linear portion.

5. The method of claim 1, wherein the bottom surface of the mold cavity comprises an edge region that extends from an edge of the bottom surface to partially overlap with an outermost die stack overlap region among the die stack overlap regions with which the die stacks overlap.

6. The method of claim 5, further comprising further dispensing the MUF material in the edge region to form a second dispensed pattern that extends along the edge region.

7. The method of claim 6, wherein the second dispensed pattern is formed to have a circular shape.

8. The method of claim 6, wherein the second dispensed pattern is formed to partially overlap with the first dispensed pattern.

9. The method of claim 4, further comprising further dispensing the MUF material in the central region with the center of the bottom surface of the mold cavity to form a third dispensed pattern with a spiral shape.

10. The method of claim 9, wherein the third dispensed pattern is formed to partially overlap with the first dispensed pattern.

11. The method of claim 1, wherein the die stacks are formed by vertically stacking one or more semiconductor dies.

12. The method of claim 1, wherein the die stacks comprise a plurality of semiconductor dies that are vertically stacked with first gaps between each other and stacked to have a second gap between the plurality of semiconductor dies and the base substrate,
    wherein the die stacks are spaced apart from each other by a third gap, and
    wherein the MUF material fills the first, second, and third gaps.

13. The method of claim 1, wherein the base substrate comprises a semiconductor wafer with an integrated circuit.

14. The method of claim 1, wherein the base substrate comprises a printed circuit board (PCB).

15. The method of claim 1, wherein, in closing the mold cavity, the die stacks are inserted into the closed mold cavity.

* * * * *